US006243033B1

(12) United States Patent
Mizuno

(10) Patent No.: US 6,243,033 B1
(45) Date of Patent: Jun. 5, 2001

(54) SIGNAL VALUE REPRESENTING METHOD AND SYSTEM

(75) Inventor: Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/351,322

(22) Filed: Jul. 12, 1999

(30) Foreign Application Priority Data

Jul. 17, 1998 (JP) .................................................. 10-202567

(51) Int. Cl.$^7$ ............................... H03M 1/66; H03M 1/62
(52) U.S. Cl. ..................... 341/144; 341/152; 341/166; 341/138
(58) Field of Search ................................. 341/144, 166, 341/138, 152, 110

(56) References Cited

U.S. PATENT DOCUMENTS

| 5,021,786 | * | 6/1991 | Gerdes ................................. 341/143 |
| 5,742,245 | * | 4/1998 | Noro ................................... 341/144 |
| 5,870,049 | * | 2/1999 | Huang et al. ........................ 341/144 |
| 5,933,107 | * | 8/1999 | Tan ..................................... 341/144 |

FOREIGN PATENT DOCUMENTS

| 61-102821 | 5/1986 | (JP) . |
| 7-22948 | 1/1995 | (JP) . |

* cited by examiner

*Primary Examiner*—Michael Tokar
*Assistant Examiner*—Vibol Tan
(74) *Attorney, Agent, or Firm*—Young & Thompson

(57) ABSTRACT

A signal value representing method in which both wide dynamic range and high precision can be realized in combination with a low power source voltage. M+1 signal lines are used of which, M signal lines are digital signal values and one signal line is an analog signal value. The range of the values represented by the analog signal value representing method is equated to the smallest value of the digital signal value representing method. The signal value is represented by the combination of a discretely changing wide dynamic range signal, represented by the digital signal value representing method employing M signal lines and a continuously variable high precision signal which is represented by the analog signal value representing method employing a sole signal line and which represents a signal level position within the interval of the discrete values.

19 Claims, 2 Drawing Sheets

SIGNAL VALUE REPRESENTING METHOD AND SYSTEM

FIELD OF THE INVENTION

This invention relates to a method and system for representing a signal value. More particularly, it relates to a signal value representing method aimed at enhancing the dynamic range and improving the precision.

DESCRIPTION OF THE RELATED ART

In representing the signal value, a broad dynamic range (range of the values that can be represented) and a high precision in the signal value are generally required. In keeping up with the recent tendency towards finer design rule in the semiconductor devices, it is desired to reduce the power source voltage of the semiconductor device to improve the reliability and to reduce power consumption of the device.

In the conventional representation of analog signal values, there are an analog signal value representing system and a digital signal representing system.

In the analog signal representing system, one signal line is used for transmission, with the signal value being represented by the potential level between a first power source level and the second power source level. The signal value can be continuously represented by a level between the first power source level and the second power source level. Therefore, the dynamic range is proportionate to the difference between the first power source level and the second power source level.

The digital signal value representing method is realized using N signal lines, with the potential level of the signal line being the first power source level or the second power source level. In this case, the signal level can be represented in $2^N$, where $\char`\^$ denotes the power. Therefore, the dynamic range is $2^N$.

SUMMARY OF THE DISCLOSURE

The following problems have been encountered in the course of the investigations toward the present invention.

With the present analog signal value representing system, the dynamic range is lowered with the lowering of the power source voltage. Simultaneously, the signal precision is deteriorated. This deterioration in signal precision may possibly be accounted for as follows:

If, for example, a signal having delay time ranging from 0 ns (nanosecond) to 100 ns is represented by the power source voltage of 5 V, with the dynamic range being 5 V, that is if the time is represented by voltage by linear conversion, the time of 20 ns can be represented by the voltage of 1 V.

If the power source voltage is reduced to 1V, the dynamic range is 1, such that 1 V needs to be represented by 100 ns.

If the noise of, for example, 100 mV is induced in the signal value with the power source voltage of 5 V, there is produced an error of 2 ns in the delay time. If, with the power source voltage of 1 V, the noise of 100 mV is induced in the signal value, the error amounts to 10 ns.

If the noise is induced in the signal value, the low power source voltage is subjected to and affected by a larger noise, that is, deteriorated in precision.

The digital signal value representing method is not affected by the lowering of the power source voltage. However, the precision, that is resolution, depends on the number N of the signal lines, and is proportional to $\frac{1}{2}^N$.

That is, if the number of signal lines is increased, the precision is increased, however, the increased number of the signal lines leads to the increased area of the apparatus. That is, the digital signal value representing method has the problem that, if the number of signal lines used is small, the precision is correspondingly lowered.

In view of the above-mentioned problem of the prior art, it is an object of the present invention to provide a signal value representing method or system having a wide dynamic range and high precision at a low power source voltage.

According to an aspect of the present invention, there is provided a signal value representing method which resides in the combination of analog signal value representation and digital signal value representation. In a second aspect, the signal representation is by M+1 signal lines, of which M signal lines are used for the digital signal value representation and the remaining one signal line is used for analog signal value representation. In a third aspect, the signal value represented by the analog signal value representation is set so as to be equal to the smallest value of the digital signal value representing method.

According to a fourth aspect there is provided a signal value representing system comprising: M digital signal input lines where M is positive integer and an analog signal input line, and a synthesizing unit combining M digital input signals input from the M digital signal input lines and an analog signal to output a synthesized signal wherein the synthesized signal is represented by the combination of a digital signal value representation supplied by the M digital signal input lines and an analog signal value representation supplied by the sole analog signal input line. The digital input signal represented by the digital signal value representation by the M digital signal input lines is set to have an interval of discrete values, of the same value as a size represented by the analog signal value representation supplied by the sole analog signal input line.

The digital signal value representation is formed of a plurality of discrete value signals under a weighted representation of signal, and the analog signal value representation is formed of a sole continuous value signal.

The continuous value signal is of a value associated with the smallest resolution represented by said discrete value signals.

The synthesized signal can be output as a signal value of voltage, current, frequency or delay time.

According to a fifth aspect of the invention, there is provided a signal value representing system comprising: means for inputting a plurality of discrete value signals under a weighting representation of a signal with a pre-set resolution, means for inputting a sole continuous-valued signal, means for synthesizing a sole signal value by combining the discrete value signals and the sole continuous-valued signal to output the sole signal value.

The sole continuous-valued signal corresponds to the smallest resolution given by the discrete-valued signals.

According to a sixth aspect of the present invention there is provided a signal synthesizing system comprising: a sole analog input line to supply a sole analog signal, a plurality of input lines supplying discrete signals from each other, and a synthesizing unit which combines the sole analog signal and the discrete signals to output a synthesized signal, wherein said sole analog signal is selectively combined with at least one of the discrete signals.

The synthesizing unit comprises a series of switching elements, one receiving the sole analog signal and each of the rest of the switching elements receiving one of the discrete signals, respectively, and the switching elements have a common output to provide the synthesized signal.

The switching elements comprise transistors.

The transistors comprises FETs having a common output to provide the synthesized signal.

The common output further comprises a current mirror circuit to provide a current output.

The synthesizing unit comprises a delay time varying unit and a selection unit, the delayed time varying unit receiving an input signal and delaying time in accordance with the sole analog signal to output a delayed signal, the selection unit receiving the discrete signals, and wherein the selection unit selectively receives the delayed signal from the delay time varying unit to synthesize a delayed signal representing a discrete delay time having a modified delay time with the sole analog signal.

The delay time unit comprises a plurality of tandem-arrayed delaying elements, each being selectable or switchable by the selection unit according to the discrete signals, each of the delaying elements being controlled by the sole analog signal.

One output of the delaying elements is selected by the selection unit, delay time of the output being controlled by the sole analog signal.

An interval of the discrete signals is set to the same range of value as that of the sole analog signal.

Still further aspects of the present invention are mentioned in the claims, which are incorporated herein by reference thereto.

PREFERRED EMBODIMENTS OF THE INVENTION

A present embodiment of the present invention is explained. In the present embodiment of the present invention, a signal value is represented by the combination of a discretely represented wide dynamic range signal represented by the digital signal value representing method with M signal lines and a continuously represented high precision signal which is represented by the analog signal value representing method with a sole signal line and which is able to represent the signal level position within the interval of the discrete values (difference between neighbouring discrete values). Note M is a positive integer of at least 2 and may be 3, 4 or more.

Thus, even with the low power source voltage, a signal value can be represented which has abroad dynamic range and high precision.

Figure 1:
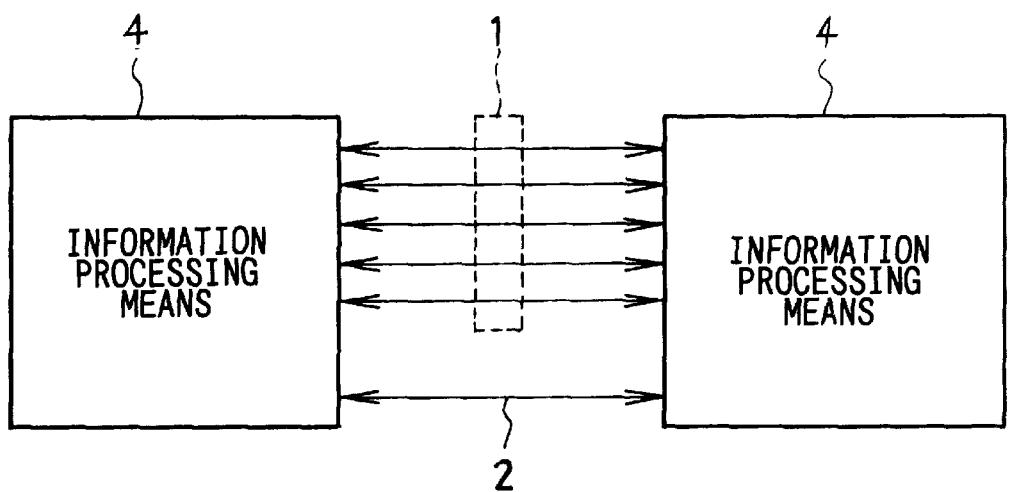
FIG. 1 shows the structure of a first embodiment of the present invention.

Also, even if the precision is increased, there is no risk of the apparatus being increased in area due to the increased number of signal lines ascribable to the digital signal value representing method to render it possible to prevent the apparatus from being increased in area. The present invention will be explained in detail with reference to the drawings. Description of Preferred Embodiments FIG. 1 shows a structure of an embodiment of the present invention. Referring to FIG. 1, the present embodiment includes a signal line generally indicated by 1 and having M signal lines of the digital signal value representing system, a signal line 2, comprised of a sole signal line, represented by the analog signal value representing system. These signal lines 1, 2 are used in exchanging signals between information processing means 4. The spacing between discrete values of a signal represented by the signal value representing method implemented by M signal lines, is set so as to be equal to the value that can be represented by the sole analog signal value representing method.

The discretely changing signal, having the wide dynamic range, represented by the digital signal value representing method with M signal lines, and a continuously variable high-precision signal, represented by the analog signal value representing method, employing a sole signal line, for representing the signal level position within the spacing (interval) of the discrete signal value, are combined to represent a signal value.

The characteristics of the wide dynamic range, obtained with the digital signal value representing method, are retained even with the low power source voltage. Also, since the signal position of a minute signal range corresponding to the interval between the discrete values, is represented by the analog signal value representing system, it is possible to improve the precision. Since the interval between the discrete values of the digital signal can be reduced sufficiently even with the low power source voltage, it is possible to evade the problem of deteriorated precision such as is incurred if only the analog signal value representing system is used.

Moreover, even if the precision is increased, the apparatus is not increased in area as a result of the increased number of the signal lines incurred with the digital signal value representing method, thus producing the meritorious effect of the reduced area occupied by the apparatus.

The information processing means 4, which is made up of, for example, an integrated circuit or a computer system, is not explained specifically since the structure itself of the information processing means 4 is not directly pertinent to the subject matter of the present invention.

Figure 2:
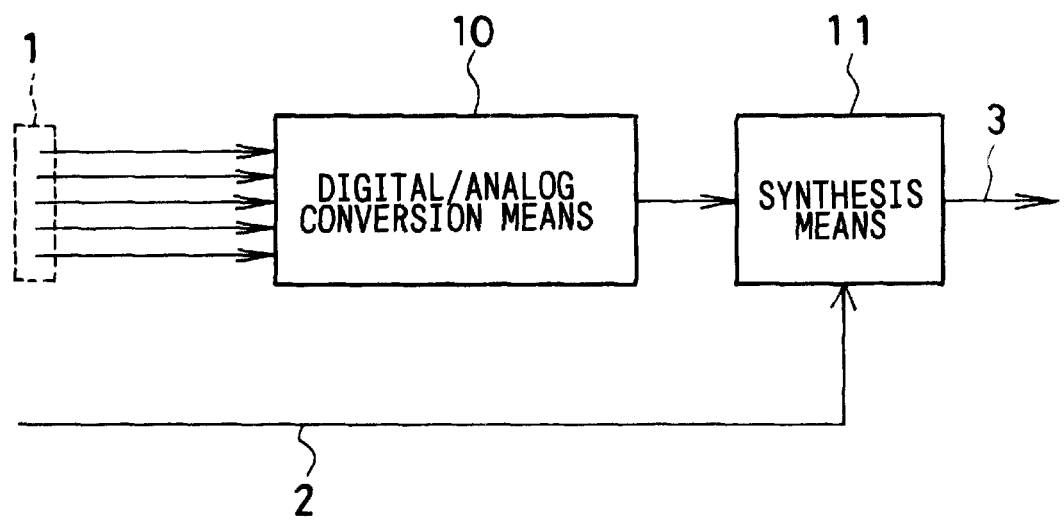
FIG. 2 shows the structure of a second embodiment of the present invention.

FIG. 2 shows the structure of a second embodiment of the present invention. Referring to FIG. 2, the present second embodiment includes a signal line 1, made up of M signal lines, represented by the digital signal value representing system, and a signal line 2, comprised of a sole signal line, represented by the digital signal value representing system. The information on the M signal lines, represented by the digital signal value representing system, is converted by digital/analog conversion means 10 into an analog value. An output value, obtained at this time, is represented by, for example, (1) a representing method employing the voltage level, (2) a representing method employing the current level, (3) a representing method employing the frequency value, or (4) a representing method employing the delay time. This value is summed to the information on the sole signal line representing the analog signal value representing method by synthesis means 11 and output at a signal line 3.

Since the discretely changing signal of a wide dynamic range, represented by the digital signal value represented method employing M digital signal lines, is synthesized (combined) to a continuously changing signal of high precision, represented by the analog signal value representing method employing a sole signal line, to represent a signal value, there is accrued the result that the wide dynamic range and the high precision can be realized even with the low power source voltage. There is also derived the result that the apparatus is not increased in area due to the increased number of the signal lines produced by the digital signal value representing method even if the precision is increased.

Figure 3:
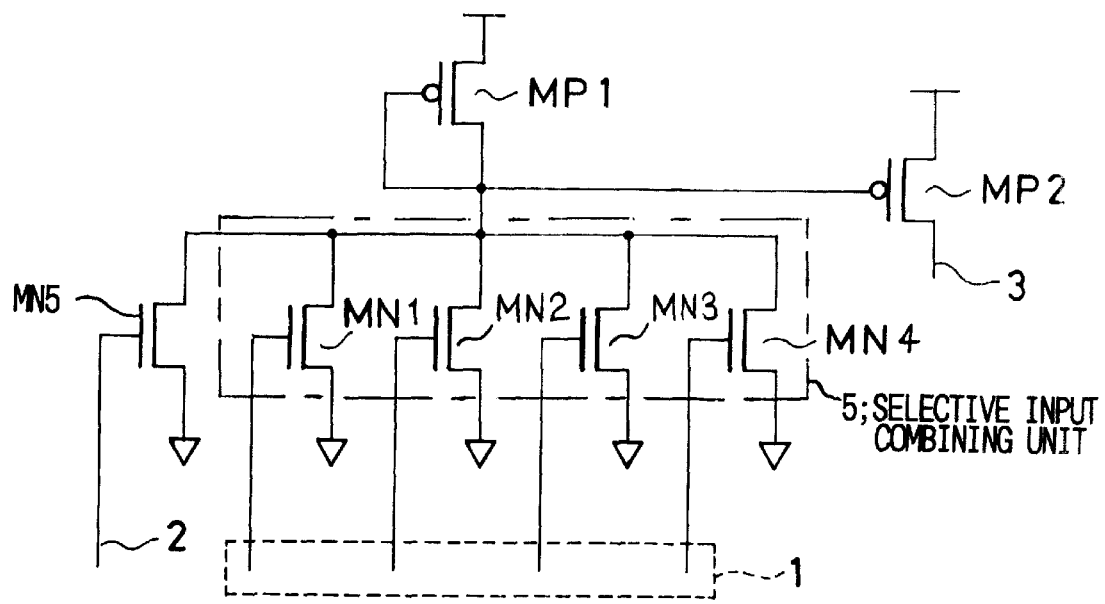
FIG. 3 shows the structure of a third embodiment of the present invention.

FIG. 3 shows the structure of a third embodiment of the present invention, Referring to FIG. 3, the present third embodiment includes a signal line, generally indicated at 1, having M signal lines, represented by the digital signal value representing system, and a signal line 2 by a sole signal line, represented by the analog signal value representing system. There is produced on a signal line 3 the current proportionate to the magnitude of the value obtained on combining the signal lines 1 and 2.

The drains of transistors MN1 to MN4, gates of which are connected to M signal lines 1, where M is 4 in FIG. 3, and the drain of a transistor MN5, the gate of which is connected to the signal line 2, are connected in common to a drain of a transistor MP1, the gate of which is connected to a transistor MP2. The transistor MP1 has its source connected to a power source and has its gate and drain coupled together. The transistor MP1 has its gate connected to the gate of the transistor MP2, the source of which is connected to the power source. The transistors MP1, MP2 constitute a current mirror circuit. An output current is retrieved from the drain of the transistor MP2. The transistors MN1 to MN4, having the gates connected to the signal line 1 and having the drains connected in common, are equivalent to a digital/analog conversion means of the current outputting mode. In other words, MN1 to MN4 marked by 5 act as a selective input (and combining) unit of discrete signals. The current mirror circuit, to the input ends of which are connected the common junction of the drains of the transistors MN1 to MN4 and the drain of the transistor MN5, the gate of which is connected to the signal line 2, constitutes synthesis means 11.

Assuming that the channel lengths L of the transistors MN1 to MN4 are the same, the ratio of channel widths thereof is set to 1:2:4:8, the channel length L of the transistor MN5, the gate of which is connected to the signal line 2, is the same as the channel lengths L of the transistors MN1 to MN4, and the channel width of the transistor MN5 is set so as to be equal to the smallest of the channel widths of the transistors MN1 to MN4 connected to the M signal lines, that is to the channel width of the transistor MN1, the interval of discrete values represented by the digital signal value representing method by M signal lines can be set so as to be equal to the range of the values that can be represented by the analog signal value representing method employing a sole analog signal line. The transistors MN1 to MN4 connected to the signal line 1 comprised of M signal lines are turned on and off by the high/low signals on the signal line 1, such that the current flowing when only the transistor MN4 is on is eight times as much as the current flowing when only the transistor MN1 is on. Similarly, the current flowing when only the transistor MN3 is on is four times as much as the current flowing when only the transistor MN1 is on and the current flowing when only the transistor MN2 is on is twice as much as the current flowing when only the transistor MN1 is on.

Since the signal value is represented by the combination of a discretely changing signal of a wide dynamic range represented by the digital signal value representing method employing M signal lines and a continuously variable signal of high precision represented by the analog signal value representing method employing a sole signal line and which represents a signal level position within the interval of the discrete values, there is derived a meritorious effect of a broad dynamic range and high precision even at a low power source voltage. There is also derived another meritorious effect that, even if the precision is raised, the apparatus is not increased in size as a result of the increased number of the signal lines ascribable to the use of the digital signal value representing method.

Figure 4:
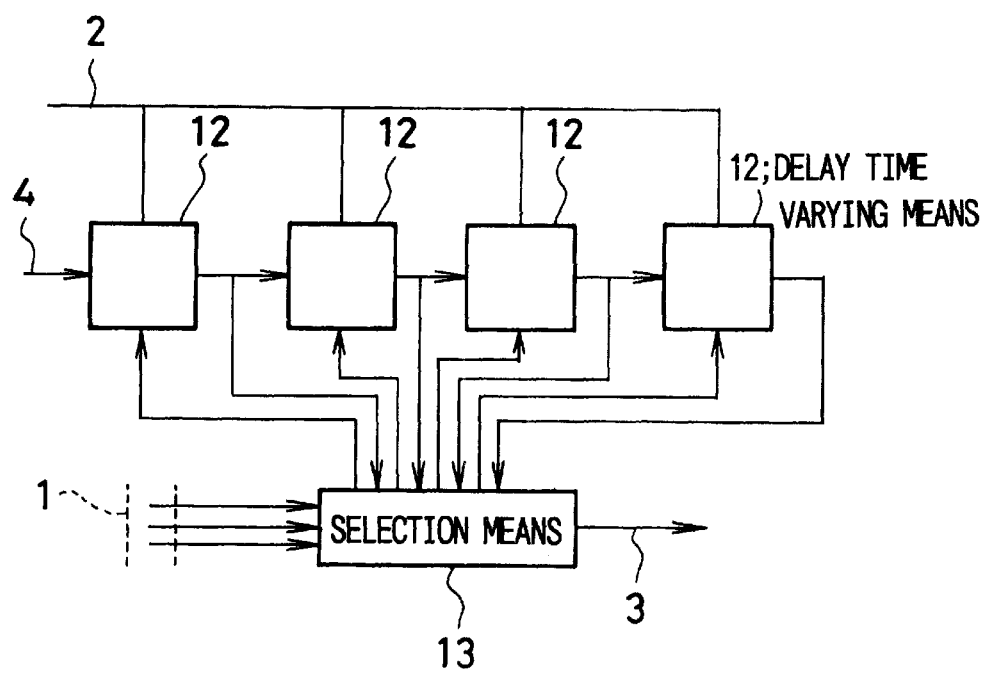
FIG. 4 shows the structure of a fourth embodiment of the present invention.

FIG. 4 shows the structure of a fourth embodiment of the present invention. The present embodiment includes a signal line 1 of M signal lines, represented by the digital signal value representing method, and a signal line 2 of a sole signal line, represented by the analog signal value representing method. The present embodiment is directed to an apparatus for delaying an input signal to the signal line 4 in an amount corresponding to the combination of the signal lines 1 and 2 and for outputting the resulting delayed signal at the signal line 3.

Output lines of four delay time varying means 12 are selected with selection means 13 by the signal line 1 of M signal lines (three signal lines in FIG. 4). In addition, the delay time of one 12 of the four delay time varying means 12 arranged within (on) the signal line 4 selected by the selection means 13 based on the signal line 4 is controlled by the signal line 2 represented by the analog signal value representing method employing the sole signal line.

Meanwhile, the delay time of the delay time varying means 12 other than the delay time varying means 12 arranged within (on) the signal line 4 and selected by the selection means 13 is set so as to be the maximum delay time.

The interval of the discrete values represented by the digital signal value representing method by the M signal lines can be equated to the range of the values represented by the analog signal value representing method by the sole signal line.

Since the signal value is represented by the combination of a discretely changing signal of a wide dynamic range represented by the digital signal value representing method employing M signal lines and a continuously variable signal of high precision represented by the analog signal value representing method employing a sole signal line and which represents a signal level position within the interval of the discrete values, there is derived a meritorious effect of a broad dynamic range and high precision even at a low power source voltage. There is also derived another meritorious effect that, even if the precision is raised, the apparatus is not increased in size due to the increased number of the signal lines ascribable to the use of the digital signal value representing method.

If 0 ns to 100 ns are represented solely by the 4-bit digital signal value representing method, the interval of the discrete values is $100/2^4=6.25$ ns. That is, the precision is 6.25 ns. For raising this precision, it is necessary to increase the number M of the signal lines of the digital signal value representing method. If only the analog signal value representing method is used, $100/5=20$ ns/V for the power source voltage of 5 V, such that, if the noise of the power source voltage is 100 mV, the precision is 2 ns. However, with the power source voltage of 1 V, similar computations lead to the precision of 10 ns, which is worse than a value possible with the digital signal value representing method. In short, the analog signal value representing method gives poorer precision with the lower power source voltage. Stated conversely, the signal level range that can be represented, that is the dynamic range, is as narrow as ⅕ if it is attempted to equate the precision for the power source voltage of 5 V to that for the power source voltage of 1 V.

In the present embodiment, if M is 4 and the power source voltage is 1 V, the interval between the discrete values is 100/16=6.25 ns, with this interval between the discrete values being represented by the analog signal value of 1 V, so that 6.25/1=6.25 ns/V. With the noise in the power source voltage of 100 mV, the time precision corresponding to this 100 mV is 0.625 ns. With the conventional representing method, if the noise of 100 mV is induced in the signal value for the power source voltage of 1 V, the error is 10 ns.

That is, high precision is realized even with the power source voltage as low as 1 V. On the other hand, if the precision is raised, the apparatus may be of a small area since there is no risk of increased number of the signal lines due to the use of the digital signal value representing method.

It is to be noted that the present invention is not limited to the above-described embodiments and comprises a variety of modifications within the principle of the invention.

The meritorious effect of the present invention are summarized as follows.

According to the present invention, described above, the signal value is represented by the combination of a discretely changing wide dynamic range signal, represented by the digital signal value representing method employing M signal lines, and a continuously variable high precision signal, represented by the analog signal value representing method of a sole signal line, and which represents the signal level position within the interval of the discrete signals, there is achieved the meritorious effect of the wide dynamic range and high precision even with the low power source voltage.

It should be noted that other objects of the present invention will become apparent in the entire disclosure and that modifications may be done without departing the gist and scope of the present invention as disclosed herein and appended herewith.

Also it should be noted that any combination of the disclosed and/or claimed elements, matters and/or items may fall under the modifications aforementioned.

What is claimed is:

1. A signal value representing method comprising the steps of:
   representing a signal by the combination of a digital signal value representation by M signal lines and an analog signal value representation by a sole signal line; and
   setting the interval of discrete values of the signal represented by the digital signal value representation by M signal lines so as to be of the same value as a size represented by the analog signal value representation by the sole signal line.

2. A signal value representing method comprising the steps of:
   representing a signal by the combination of a digital signal value representation by M signal lines and an analog signal value representation by a sole signal line; and
   representing a signal value by the combination of a plurality of discrete value signals under a weighted representation of the signal and a sole continuous value signal.

3. The signal value representing method as defined in claim 2,
   wherein the continuous value signal is of a value associated with the smallest resolution represented by said discrete value signal.

4. A signal value representing method comprising the steps of:
   inputting a plurality of discrete value signals under a weighting representation of a signal with a pre-set resolution and a sole continuous-valued signal;
   synthesizing a sole signal value corresponding to a combination of said signals; and
   outputting said sole signal value,
   wherein said synthesized signal is outputted as a signal value of one selected from the group consisting of voltage, current, frequency or delay time.

5. A signal value representing method comprising the steps of:
   inputting a plurality of discrete value signals under a weighting representation of a signal with a pre-set resolution and a sole continuous-valued signal;
   synthesizing a sole signal value corresponding to a combination of said signals; and
   outputting said sole signal value,
   wherein said continuous-valued signal corresponds to the smallest resolution represented by said discrete-valued signal.

6. A system wherein a sole signal value is transmitted by using a plurality of discrete-valued signals under weighted representation of a signal with a pre-set resolution and by using a sole continuous-valued signal provided separately from said discrete-valued signals, and
   wherein said sole continuous-valued signal is set to an amplitude so s to be equal to the smallest resolution of said discrete-valued signals.

7. A signal value representing system comprising:
   M digital signal input lines where M is a positive integer and an analog signal input line, and
   a synthesizing unit combining M digital input signals input from the M digital signal input line and an analog signal to output a synthesized signal,
   wherein the synthesized signal is represented by the combination of a digital signal value representation supplied by the M digital signal input lines and an analog signal value representation supplied by the sole analog signal input line,
   wherein the digital input signal represented by the digital signal value representation by the M digital signal input lines is set to have an interval of discrete values, of the same value as a size represented by the analog signal value representation supplied by the sole analog signal input line.

8. A signal value representing system comprising:
   M digital signal input lines where M is a positive integer and an analog signal input line, and
   a synthesizing unit combining M digital input signals input from the M digital signal input line and an analog signal to output a synthesized signal,
   wherein the synthesized signal is represented by the combination of a digital signal value representation supplied by the M digital signal input lines and an analog signal value representation supplied by the sole analog signal input line,
   wherein said digital signal value representation is formed of a plurality of discrete value signals under a weighted representation of signal, and
   wherein said analog signal value representation is formed of a sole continuous value signal.

9. The signal value representing system as defined in claim 8 wherein the continuous value signal is of a value associated with the smallest resolution represented by said discrete value signals.

10. A signal value representing system comprising:

M digital signal input lines where M is a positive integer and an analog signal input line, and a synthesizing unit combining M digital input signals input from the M digital signal input line and an analog signal to output a synthesized signal, wherein the synthesized signal is represented by the combination of a digital signal value representation supplied by the M digital signal input lines and an analog signal value representation supplied by the sole analog signal input line, wherein said synthesized signal is output as a signal value of one selected from the group consisting of voltage, current, frequency or delay time.

11. A signal value representing system comprising:

means for inputting a plurality of discrete value signals under a weighting representation of a signal with a pre-set resolution, means for inputting a sole continuous-valued signal; and means for synthesizing a sole signal value by combining said discrete value signals and said sole continuous-valued signal to output said sole signal value, wherein said sole continuous-valued signal corresponds to the smallest resolution given by said discrete valued signals.

12. A signal synthesizing system comprising:

a sole analog input line to supply a sole analog signal;

a plurality of input lines supplying discrete signals from each other; and a synthesizing unit which combines the sole analog signal and the discrete signals to output a synthesized signal, wherein said sole analog signal is selectively combined with at least one of the discrete signals, wherein said synthesizing unit comprises a series of switching elements, one receiving the sole analog signal and each of the rest of the switching elements receiving one of the discrete signals, respectively, and said switching elements have a common output to provide the synthesized signal.

13. The signal synthesizing system as defined in claim 12, wherein said switching elements comprise transistors.

14. The signal synthesizing system as defined in claim 13, wherein said transistors comprises FETs having a common output to provide the synthesized signal.

15. The signal synthesizing system as defined in claim 13, wherein said common output further comprises a current mirror circuit to provide a current output.

16. A signal synthesizing system comprising:

a sole analog input line to supply a sole analog signal;

a plurality of input lines supplying discrete signals from each other; and a synthesizing unit which combines the sole analog signal and the discrete signals to output a synthesized signal, wherein said sole analog signal is selectively combined with at least one of the discrete signals, wherein said synthesizing unit comprises a delay time varying unit and a selection unit, the delay time varying unit receiving an input signal and delaying time in accordance with said sole analog signal to output a delayed signal, the selection unit receiving said discrete signals, and wherein said selection unit selectively receives the delayed signal from said delay time varying unit to synthesize a delayed signal representing a discrete delay time having a modified delay time with said sole analog signal.

17. The signal synthesizing system as defined in claim 16, wherein said delay time unit comprises a plurality of tandem-arrayed delaying elements, each being selectable or switchable by said selection unit according to said discrete signals, each of the delaying elements being controlled by said sole analog signal.

18. The signal synthesizing system as defined in claim 17, wherein one output of the delaying elements is selected by the selection unit, delay time of said one output being controlled by said sole analog signal.

19. The signal synthesizing system as defined in claim 16, wherein an interval of said discrete signals is set to the same range of value as that of said sole analog signal.

* * * * *